(12) United States Patent
Tomioka et al.

(10) Patent No.: US 6,285,557 B1
(45) Date of Patent: Sep. 4, 2001

(54) CARD EJECTING DEVICE

(75) Inventors: Shouichi Tomioka, Tokyo; Nobuhito Ebine, Kanagawa, both of (JP)

(73) Assignees: Hirose Electric Co., Ltd.; Sony Corporation, both of Tokyo (JP)

( * ) Notice: Subject to any disclaimer, the term of this patent is extended or adjusted under 35 U.S.C. 154(b) by 0 days.

(21) Appl. No.: 09/326,554

(22) Filed: Jun. 7, 1999

(30) Foreign Application Priority Data

Jun. 5, 1998 (JP) .................................................. 10-172128

(51) Int. Cl.[7] ....................................................... H05K 7/14
(52) U.S. Cl. ........................ 361/754; 361/753; 361/759; 361/801; 439/260; 235/486
(58) Field of Search ................................... 361/752–759, 361/728, 801, 802, 754, 798; 439/377, 945, 260; 235/441, 486, 482, 475; 211/41.17

(56) References Cited

U.S. PATENT DOCUMENTS

| 5,179,505 | * | 1/1993 | Matsuo | 361/754 |
|---|---|---|---|---|
| 5,443,395 | | 8/1995 | Wang . | |
| 5,473,505 | | 12/1995 | Kessoku et al. . | |
| 5,692,208 | | 11/1997 | Felcman et al. . | |
| 5,717,542 | * | 2/1998 | Yokota et al. | 360/99.06 |

FOREIGN PATENT DOCUMENTS

| 0585825 | 3/1994 | (EP) . |
|---|---|---|
| 07037044 | 2/1995 | (JP) . |

* cited by examiner

Primary Examiner—Jayprakash N. Gandhi
(74) Attorney, Agent, or Firm—Kanesaka & Takeuchi

(57) ABSTRACT

In a card ejecting device, when a card is slidingly inserted into a case-shaped holder up to a predetermined position, the card is connected to contacting portions of contacts attached to the holder, and a rear-end portion of the card is pushed in a forward directly by pressing portions of a slider which slides while being guided by the holder, so as to move the card up to a removing position. The pressing portions are formed by front end faces of pieces provided on the slider in such a manner as to extend in the direction in which the card is pressed. Spaces (notched portions) allowing the advance of the pressing portions during the advance of the slider are formed in the holder.

6 Claims, 4 Drawing Sheets

CARD EJECTING DEVICE

BACKGROUND OF THE INVENTION

1. Field of the Invention

The present invention relates to a card ejecting device, and more particularly to a card ejecting device for causing a card inserted in a holder having contacts to be ejected from the holder.

2. Description of the Related Art

In electronic equipment, a card having information, such as a PC card, is inserted into the electronic equipment as required and in such a manner as to be capable of replacing a different card, and is connected to a circuit of the electronic equipment, so as to enhance the functions of the electronic equipment. The card is accommodated in a holder through an insertion slit provided in the electronic equipment. Contacts are provided in the holder, and the card is electrically connected to the contacts and cooperates with a circuit portion in the equipment, to which the contacts are connected.

When the card is unnecessary or is replaced with another card, the card is removed from the electronic equipment, and the removal is effected by a card ejecting mechanism. The card ejecting mechanism generally has an eject lever having an eject button, which is operated from the outside, a link mechanism connected thereto, and a slider which receives the force from the eject lever through the link mechanism and presses the card while the movement of the slider is guided by the holder, so as to move the card to a removing position.

The basic principle of operation of the holder and the slider is shown in FIGS. 4(A) and 4(B), for example.

In FIG. 4(A), a stepped guide portion 51A for accommodating a card C is provided in a holder 51, and a space for insertion of the card C is formed by the stepped guide portion 51A and a half case-shaped cover member 52 attached to an upper surface side of the holder 51. The space is open rightwardly in FIG. 4(A). In addition, a slider 53 which is guided by the cover member 52 is provided on the holder 51. The slider 53 is provided with a pressing portion 53A which is formed by being bent on its rear end side. The slider 53 is engaged with a link mechanism (not shown) attached to the cover member 52, and the link mechanism is connected to an eject lever (not shown) having an eject button which is operated from the outside.

When the card C is inserted from the right-hand side into the inserting space formed by the holder 51 and the cover member 52, and is accommodated in a predetermined position in FIG. 4(A), resiliently contacting portions (not shown) of contacts held by the holder 51 are brought into contact with circuit portions formed on the surface of the card C. Hence, the card C is electrically connected to a predetermined circuit in the electronic equipment, to which the contacts are connected.

When the card C is to be removed, a user of the electronic equipment presses the aforementioned eject button. The eject lever transmits this pressing force (the force oriented in the leftward direction in the drawing) to the slider 53 through the link mechanism as a force for moving the slider 53 in the forward direction (a force oriented in the rightward direction in the drawing). Upon receiving this force, the slider 53 moves by a distance L1 in the rightward direction so as to cause the card C to project in the forward direction from the cover member 52 of the holder 51 by a large amount by means of the pressing portion 53A of the slider 53, thereby moving the card to a removing position, as shown in FIG. 4(B).

With the card C shown in FIG. 4(B), the larger the projecting distance for ejection, the larger the amount of the card C projecting from the inlet of the inserting slit in the electronic equipment and the more the removal is facilitated. Due to the tendency of demand for compact electronic equipment, the size of the device, i.e., the holder and the cover member, in the ejecting direction is generally designed to a small size up to a limit. To increase the projecting distance of the card for the ejection of the card, it is conceivable to reduce the dimension of the cover member in the aforementioned direction. In the above-described situation, however, it is difficult to do so, and if that dimension is reduced more than is necessary, the function of holding the card, the function of protecting the contacts, and the like would be impaired.

SUMMARY OF THE INVENTION

In view of the above-described circumstances, it is an object of the present invention to provide a card ejecting device which, without being made large in size, is capable of causing a card to be pushed out of the device by as large an amount as possible by moving the slider by a large distance, thereby moving the card to a removing position where the card can be removed easily.

To this end, in accordance with a first aspect of the present invention, there is provided a card ejecting device comprising: a case-shaped holder into which a card is slidingly inserted up to a predetermined position so as to allow the card to be connected to a contacting portion of a contact attached to the holder; and a slider which moves while being guided by the holder, the slider having a pressing portion for pushing a rear-end portion of the card in a forward direction so as to move the card up to a removing position, wherein a notched portion allowing the entry of the pressing portion of the slider therein is formed in the holder.

In the above-described first aspect of the invention, the pressing portion may be formed by a pressing piece provided on the slider in such a manner as to extend in a direction in which the card is pressed.

In the first aspect of the invention having the above-described arrangement, when the card is ejected, the slider pushes the card in the forward direction by its pressing portion and moves it to the removing position. At that juncture, since the pressing portion of the slider advances into the notched portion of the holder, the moving distance of the pressing portion can be set to a large distance, with the result that the card is pushed out until it projects by a large amount, thereby making it possible to remove the card easily.

Further, in accordance with a second aspect of the present invention, an arrangement is provided such that the pressing portion is formed by a pressing piece provided on the slider in such a manner as to extend from a rear end of the pressing piece in a direction in which the card is pressed, the rear end of the pressing piece being located rearwardly of a rear end of the card.

In this case, although a portion of the pressing piece projects rearwardly of the card, a space is frequently formed there in the rear of a rear-end portion of the holder, and this space can be made use of. In addition, the pressing portion may be extended further in the rearward direction and project rearwardly from the holder. In that case, since electronic components of short height are usually connected on a circuit board where the holder is mounted, so that in such a case no hindrance is caused even if the portion of the pressing piece is located in the space above them, and effective use can be made of the space instead.

In addition, an arrangement may be provided such that a portion to be pressed is provided on the slider, and a force from an eject lever having an eject button which is operated from the outside is received by the portion to be pressed through a link mechanism so as to allow the slider to move while being guided by the holder.

As described above, in accordance with the above-described first aspect of the invention, the slider for pushing out the card at the time of ejection of the card is provided with the pressing piece extending in the pressing direction, a front end portion of the pressing piece is formed as the pressing portion, and the space (notched portion) allowing the advance of the pressing portion during the advance of the slider is formed in the holder. Therefore, without making the device large in size in the pushing-out direction, the forwardly moving distance of the pressing piece can be set to a large distance so as to allow the card to project by a large amount from the front surface of the electronic equipment to the removing position, thereby facilitating the removal of the card.

In addition, in the second aspect of the present invention, since the pressing piece is made to project rearwardly of the card or the holder without providing the aforementioned notched portion, it is possible to obtain an advantage similar to that of the first aspect of the present invention.

BRIEF DESCRIPTION OF THE DRAWINGS

FIGS. 1(A) to 1(D) are diagrams illustrating a first embodiment of a card ejecting device in accordance with the present invention, in which FIG. 1(A) is a plan view, FIG. 1(B) is a front elevational view, FIG. 1(C) is a cross-sectional view taken along line C—C in FIG. 1(B), and FIG. 1(D) is a cross-sectional view taken along line D—D in FIG. 1(B);

FIGS. 2(A) and 2(B) are cross-sectional views illustrating the procedure of using the card ejecting device of the first embodiment, in which FIG. 2(A) shows the card ejecting device at the time of starting the ejection of the card, and FIG. 2(B) shows the card ejecting device upon completion of the ejection of the card;

FIGS. 4(A) and 4(B) are cross-sectional views illustrating the procedure of using a conventional card ejecting device, in which FIG. 4(A) shows the card ejecting device at the time of starting the ejection of the card, and FIG. 2(B) shows the card ejecting device upon completion of the ejection of the card.

DESCRIPTION OF THE PREFERRED EMBODIMENTS

Figure 1A:
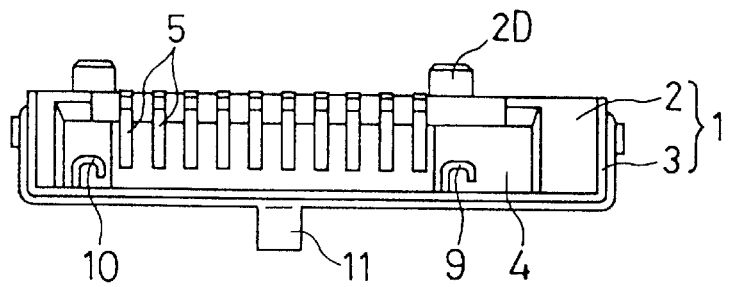
Figure 1B:
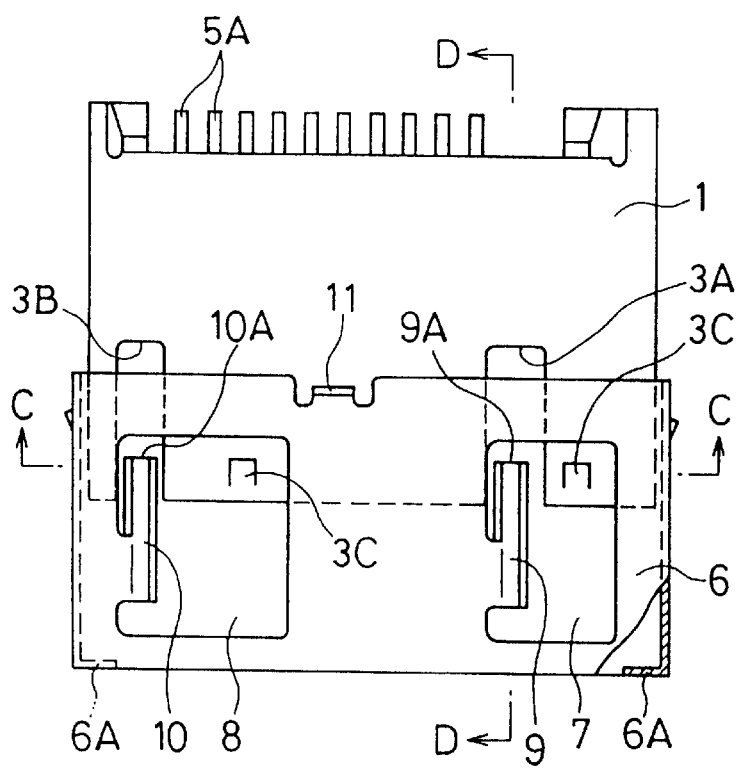
Figure 1D:
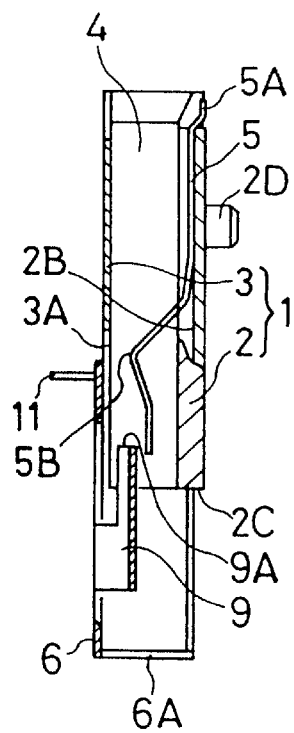

Referring now to FIGS. 1(A) to 3 of the accompanying drawings, a description will be given of the embodiments of the present invention.
First Embodiment In FIGS. 1(A) to 1(D), a holder 1 has a main body 2 and a cover member 3. The main body 2 of the holder 1 is formed of an insulating material, and a recessed portion 2A is formed therein (see FIG. 1(C)). The cover member 3 fabricated by bending a metal plate is attached to an upper surface side of the holder 1, and an inserting space 4 for insertion of a card therein is formed by the recessed portion 2A and the cover member 3. The inserting space 4 is upwardly open in FIGS. 1(B) and 1(D).

The main body 2 of the holder 1 has a plurality of groove portions 2B formed in parallel to the surface of the recessed portion 2A, and contacts 5 are respectively disposed in the groove portions 2B. Each of the contacts 5 is arranged such that one end portion thereof is formed as a connecting portion 5A exposed to the bottom surface of the main body 2, and an intermediate portion thereof is formed as a flexible contacting portion 5B which is raised above the groove portion 2B and is bent in a chevron shape.

Figure 1C:
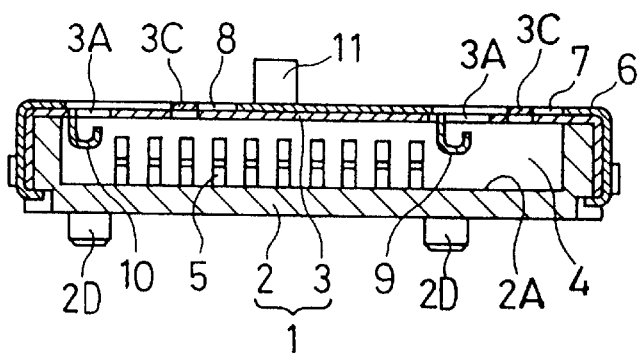

As is apparent from FIG. 1(C) as well, the cover member 3 has a form covering an upper portion of the main body 2, is secured to the main body 2, and forms the inserting space 4 between the same and the recessed portion 2A of the main body 2. A pair of elongated notched portions 3A and 3B which are rearwardly open are formed in the cover member 3. The notched portions 3A and 3B and the inserting space 4 form spaces which allow the forward advance of pressing portions 9A and 10A formed at pressing pieces 9 and 10 of a slider 6 which will be described later. In addition, a pair of stopper portions 3C, which are cut out and raised to a height corresponding to the thickness of the slider 6 to be described later, are provided on the rear-end side of the cover member 3. These stopper portions 3C are provided at positions for stopping a further rearward movement of the slider 6 from a predetermined position by retaining front edges of window portions 7 and 8 of the slider 6, which will be described later.

Although the notched portions 3A are formed in the cover member 3, the cover member 3 covers the main body 2 in a long range in the back-and-forth direction, so that the shielding effect of the cover member 3 is improved by that portion.

The slider 6 formed by processing a metal plate is supported on the holder 1, i.e., an assembly comprised of the main body 2 and the cover member 3, in such a manner as to be movable in the back-and-forth direction. As is also apparent from FIG. 1(C), the slider 6 in terms of its cross section has a substantially inverted U-shape facing the upper surface and side surfaces of the cover member 3 of the holder 1. In the slider 6, the window portions 7 and 8 are formed at positions opposing the upper surface of the cover member 3 of the holder 1. Further the slider 6 is provided with the pressing pieces 9 and 10 formed by being bent inwardly at side edges of the window portions 7 and 8 in such a manner as to form substantially J-shaped cross sections (see FIG. 1(C)) and extend in the forward direction. The front end faces of the pressing pieces 9 and 10 respectively form the pressing portions 9A and 10A for pressing the card. The pressing pieces 9 and 10 are provided at positions which respectively correspond to the notched portions 3A and 3B of the cover member 3 of the holder 1, and are arranged so as not to abut against the cover member 3 even when the slider 6 is at its most advanced position. At its most advanced position, the slider 6 is prevented from advancing further as a pair of rear-end portions 6A formed by being bent at side rear edges of the slider 6 abut against a rear-end portion 2C of the main body 2.

It should be noted that the restriction of further advance of the slider 6 when it has advanced to its predetermined position may be provided not only by the aforementioned rear-end portions 6A but by another portion. For example, an arrangement may be provided such that the front end face of the slider 6 is made to abut against a cut-out portion (not shown) provided on the cover member 3.

Further, a retainer 11 which is bent in an L-shape is provided in the center of a front edge of an upper surface of the slider 6. The retainer 11 forms a portion to be pressed which is retained by a link mechanism (not shown) which is driven by an eject lever, and the retainer 11 is subjected to an advancing force (an upwardly oriented force in FIGS. 1(B) and 1(D)) by this link mechanism.

Next, referring to FIGS. 2(A) and 2(B), a description will be given of the procedure of using the card ejecting device in accordance with this embodiment.

Figure 2A:
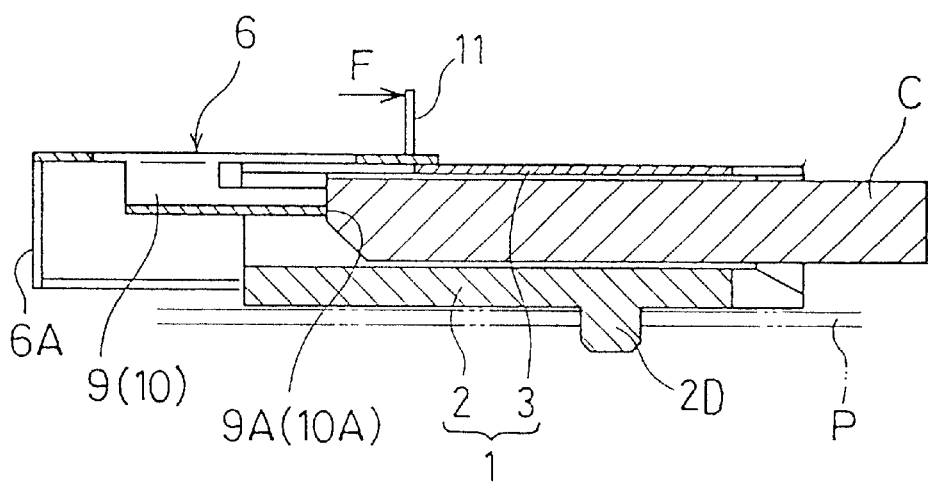
Figure 2B:
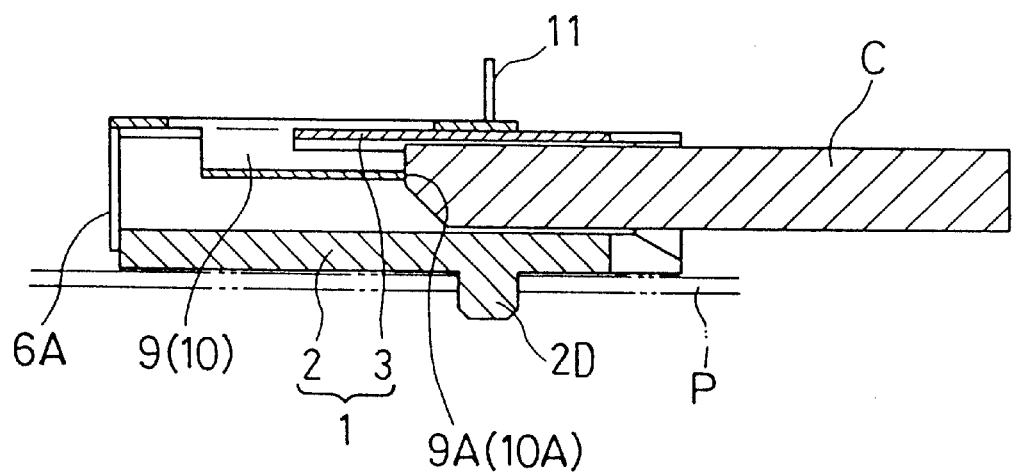

(1) Short columnar projections 2D provided on an outer surface of the bottom of the main body 2 are inserted in predetermined positioning holes in a circuit board P of electronic equipment, thereby effecting the positioning of the card ejecting device (see FIG. 2(A)).

(2) Next, connecting portions 5A of the contacts 5 which are brought into contact with the circuit board P are connected to corresponding circuit portions (not shown) of the circuit board P by soldering or the like. As a result, the card ejecting device is fixed to the circuit board. Incidentally, in a case where the card ejecting device has metal fittings or the like on the holder 1 or the like, the card ejecting device is fixed by such metal fittings or the like as well.

(3) Subsequently, the card C is inserted in the inserting space 4 in the holder 1 up to a predetermined position in the leftward direction in FIG. 2(A). At this point of time, the connecting circuit portions (not shown) formed on the lower surface of the card C resiliently press the contacting portions 5B of the contacts 5, and are electrically connected to the contacting portions 5B.

(4) When the card C is ejected, the user presses an eject button (not shown) of the already-described eject lever, which in turn causes the pressing force F to be transmitted to the retainer 11 of the slider 6 through the link mechanism (not shown). Upon receiving this pressing force F, the slider 6 slides forwardly relative to the holder 1.

(5) The pressing pieces 9 and 10 of the advancing slider 6 pushes the card C forwardly by means of the pressing portions 9A and 10A at their front end faces, and moves the card C in the same direction. Until the rear-end portions 6A of the slider 6 abut against the rear-end portion 2C of the main body 2 of the holder 1, the advancing of the slider 6 and the movement of the card C continue and end upon the abutment. At that time, since the pressing pieces 9 and 10 advance through the notched portions 3A and 3B of the cover member 3 and through an upper portion of the inserting space 4, the distance of the advance is set to be large, and the card C correspondingly projects by a large amount from the front surface of the electronic equipment, so that the card C can be removed easily.

(6) Then, the slider 6 retreats and returns to its original position by a returning force such as the insertion of another card until the front edges of the window portions 7 and 8 of the slider 6 abut against the stopper portions 3C of the cover member 3.

The present invention is not limited to the illustrated embodiment. For example, the holder may be formed as an integrated unit instead of being formed by the coupling between the main body and the cover member. In either case, it suffices if the notched portions are formed in the holder and the pressing pieces of the slider are capable of advancing. As for the pressing pieces as well, their forms may be altered variously, and instead of being fabricated by bending the metal plate for forming the slider, it is sufficient if the pressing pieces are formed by attaching another member to the slider as an integral unit. For example, the pressing pieces may be formed in pin shape, and the notched portions may be formed as holes. Further, the ejecting device of the present invention does not necessarily require that the slider be driven by the eject lever and the link mechanism. The user may directly push the slider, or the slider may be pushed by another member (mechanism).

Second Embodiment

Figure 3:
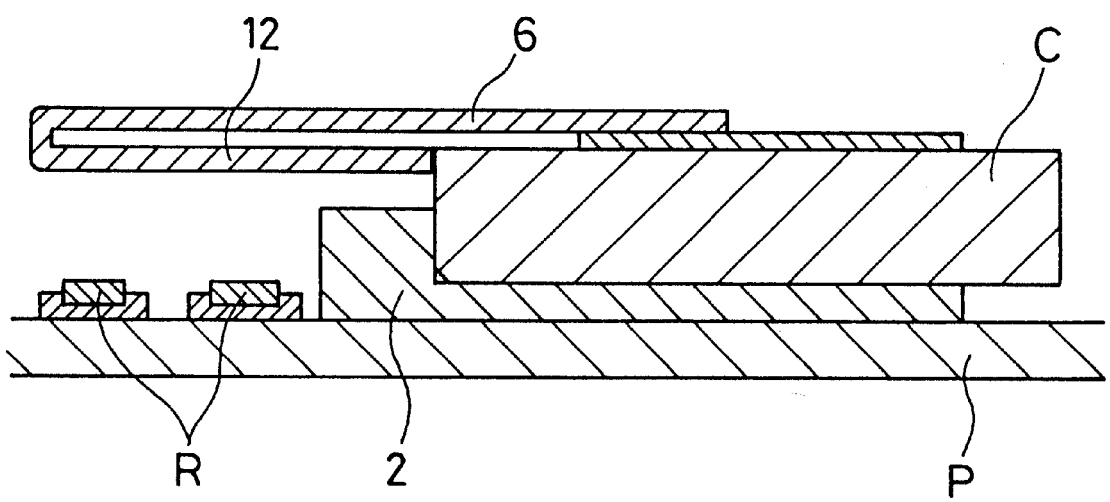
FIG. 3 is a cross-sectional view illustrating a second embodiment of the present invention.
Figure 4A:
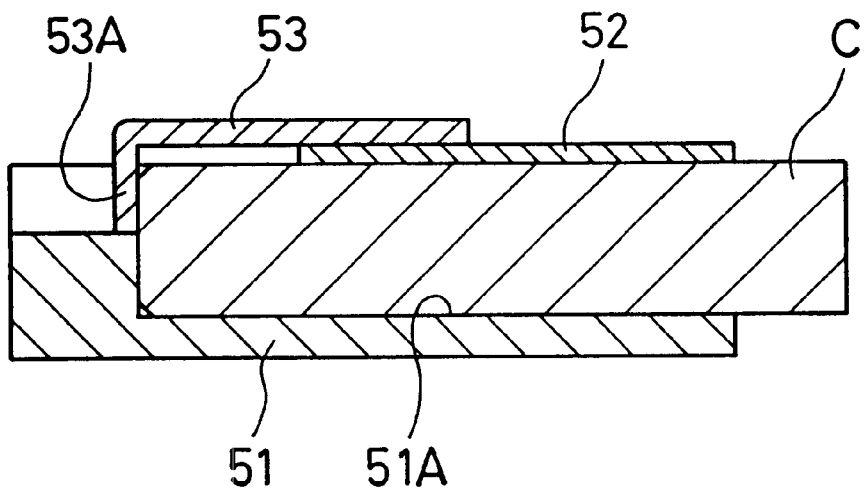
Figure 4B:
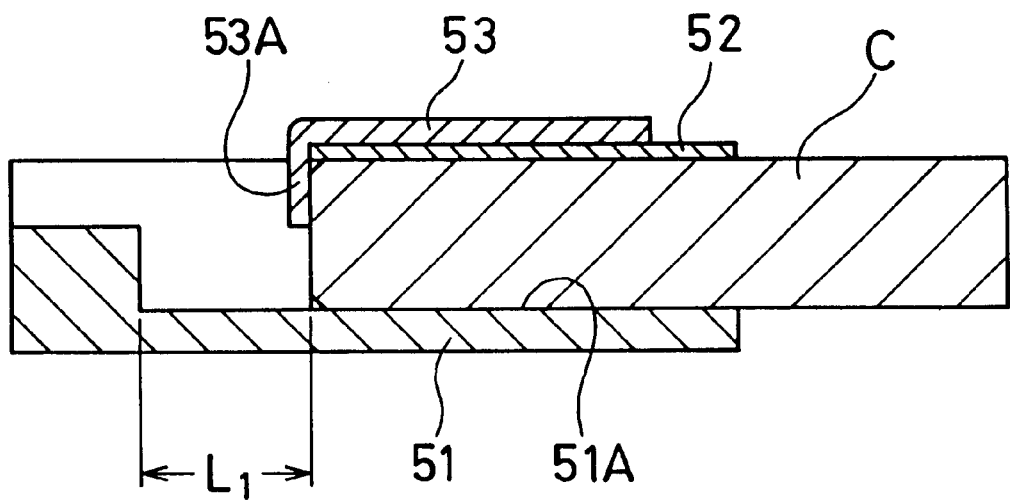

In addition, the present invention may be implemented without adopting the embodiment in which the holder having the notched portions shown in FIGS. 1 and 2 is provided. For example, as shown in FIG. 3, a rear-end portion of the slider 6 is positioned in such a manner as to project rearwardly from the main body 2 of the holder, and is folded down to form a pressing piece 12 extending in the forward direction by a large amount. In this case, the notched portions are not necessary in the holder. In the range in which the pressing piece 12 projects from the main body 2 of the holder, electronic components R of short height are usually connected on the circuit board P where the holder is mounted, so that in such a case no hindrance is caused to the projection of the pressing piece 12. Thus, when the rear end of the slider 6, i.e., the rear end of the pressing piece 12, moves in the direction toward the position of the rear end of the main body 2 of the holder, the card is pushed forward by an amount substantially corresponding to the length of the pressing piece which is set to be long.

What is claimed is:

1. A card ejecting device comprising:

a holder into which a card is slidingly inserted up to a predetermined position where said card is connected to a contacting portion of a contact which is attached to said holder;

a slider guided by said holder and having at least one pressing piece for pushing a rear-end of said card in a forward direction so as to move said card up to a removing position; and a cover attached to an upper face of said holder and having at least one notched portion provided at a rear end of said cover such that said pressing piece of said slider enters said notched portion.

2. The card ejecting device according to claim 1, wherein said pressing piece extends in a direction in which said card is pressed and has a pressing portion at a front end face thereof to press said card.

3. The card ejecting device according to claim 1, wherein said pressing piece has J-shaped cross sections.

4. The card ejecting device according to one of claims 1–3, which further comprises an eject lever having an eject button to press said slider.

5. A card ejecting device comprising:

a holder into which a card is slidingly inserted up to a predetermined position where said card is connected to a contacting portion of a contact which is attached to said holder;

a slider guided by said holder and having at least one pressing piece pushing a rear end of said card in a forward direction moving said card up to a removing position;

wherein said pressing piece extends in a direction in which said card is pressed and has a pressing portion at a front end face thereof to press said card.

6. The card ejecting device according to claim 5, which further comprises an eject lever having an eject button to press said slider.

* * * * *